(12) United States Patent
Ngai et al.

(10) Patent No.: US 8,940,099 B2
(45) Date of Patent: Jan. 27, 2015

(54) REFLOW OVEN AND METHODS OF TREATING SURFACES OF THE REFLOW OVEN

(71) Applicant: Illinois Tool Works Inc., Glenview, IL (US)

(72) Inventors: Douglas Ngai, Amarillo, TX (US); Joo Yong Tay, Singapore (SG); Wen-Feng Liu, Naperville, IL (US); Roberto P. Loera, Chicago, IL (US); Steven Dwade Cook, Vega, TX (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 14/041,316

(22) Filed: Sep. 30, 2013

(65) Prior Publication Data

US 2014/0209662 A1    Jul. 31, 2014

Related U.S. Application Data

(63) Continuation-in-part of application No. 13/437,530, filed on Apr. 2, 2012.

(51) Int. Cl.
| | |
|---|---|
| *B08B 7/00* | (2006.01) |
| *H05K 13/04* | (2006.01) |
| *B23K 1/008* | (2006.01) |
| *F27B 9/30* | (2006.01) |
| *F27B 9/32* | (2006.01) |
| *F27B 9/34* | (2006.01) |

(Continued)

(52) U.S. Cl.
CPC ............ *H05K 13/0465* (2013.01); *B23K 1/008* (2013.01); *F27B 9/3077* (2013.01); *F27B 9/32* (2013.01); *F27B 9/34* (2013.01); *F27D 1/1678* (2013.01); *F27D 17/008* (2013.01); *H05K 3/3494* (2013.01)
USPC .................. 134/4; 134/22.19; 134/38; 134/42

(58) Field of Classification Search
USPC ................................ 134/4, 42, 22.1, 22.19, 38
See application file for complete search history.

(56) References Cited

U.S. PATENT DOCUMENTS

| | | |
|---|---|---|
| 4,775,776 A | 10/1988 | Rahn et al. |
| 5,069,380 A | 12/1991 | Deambrosio |

(Continued)

FOREIGN PATENT DOCUMENTS

| | | |
|---|---|---|
| EP | 1732118 A1 | 12/2006 |
| JP | 2002198642 A | 7/2002 |

(Continued)

*Primary Examiner* — Saeed T Chaudhry
(74) *Attorney, Agent, or Firm* — Lando & Anastasi, LLP

(57) ABSTRACT

A reflow oven includes a chamber housing including surfaces that are in contact with heated air mixed with contaminants, including flux, and a water-soluble layer selectively applied to the surfaces of the chamber housing. Embodiments of the reflow oven include an acrylic-based layer, such as an acrylic paint. In one embodiment, the acrylic paint includes a water-soluble polymer, a polymer emulsion, and water. The water-soluble polymer includes butyl benzyl phthalate. In some embodiments, the acrylic paint includes 1-10% by weight butyl benzyl phthalate, 30-55% by weight acrylic polymer emulsion, and balance water. In a certain embodiment, the acrylic paint includes 1-5% by weight butyl benzyl phthalate, 35-50% by weight acrylic poly emulsion, and balance water. Methods of treating surfaces of the reflow oven are further disclosed.

13 Claims, 3 Drawing Sheets

(51) Int. Cl.
*F27D 1/16* (2006.01)
*F27D 17/00* (2006.01)
*H05K 3/34* (2006.01)

(56) References Cited

U.S. PATENT DOCUMENTS

| | | | |
|---|---|---|---|
| 5,193,735 A | 3/1993 | Knight | |
| 5,347,103 A | 9/1994 | LeMieux | |
| 5,405,074 A | 4/1995 | Den Dopper et al. | |
| 5,440,101 A | 8/1995 | Cox et al. | |
| 5,480,493 A * | 1/1996 | Harry, Jr. | 134/4 |
| 5,911,486 A | 6/1999 | Dow et al. | |
| 5,971,246 A | 10/1999 | Aun et al. | |
| 6,123,250 A | 9/2000 | De Klein et al. | |
| RE36,960 E | 11/2000 | Boswell et al. | |
| 6,145,734 A | 11/2000 | Taniguchi et al. | |
| 6,193,774 B1 | 2/2001 | Durdag et al. | |
| 6,345,757 B1 | 2/2002 | Sakuyama et al. | |
| 6,354,481 B1 | 3/2002 | Rich et al. | |
| 6,386,422 B1 | 5/2002 | Cheng et al. | |
| 6,394,794 B2 | 5/2002 | Bloom et al. | |
| 6,402,011 B1 | 6/2002 | Taniguchi et al. | |
| 6,437,289 B1 | 8/2002 | Yokota | |
| 6,446,855 B1 | 9/2002 | Rich | |
| 6,694,637 B2 | 2/2004 | Miller, Jr. et al. | |
| 6,749,655 B2 | 6/2004 | Dautenhahn | |
| 6,761,301 B2 | 7/2004 | Mukuno et al. | |
| 7,159,597 B2 | 1/2007 | Hua et al. | |
| 7,690,550 B2 | 4/2010 | Yokota | |
| 7,708,183 B2 | 5/2010 | Dautenhahn | |
| 7,735,708 B2 | 6/2010 | Yamada | |
| 7,951,244 B2 | 5/2011 | Becker et al. | |
| 7,967,913 B2 | 6/2011 | Hua et al. | |
| 7,988,031 B2 | 8/2011 | Nakamura et al. | |
| 8,196,799 B2 | 6/2012 | Dautenhahn | |
| 2002/0033183 A1 | 3/2002 | Sun et al. | |
| 2003/0205037 A1 | 11/2003 | Mullins | |
| 2003/0218058 A1 | 11/2003 | Shaw et al. | |
| 2007/0045382 A1 | 3/2007 | Shibamura et al. | |
| 2007/0284408 A1 | 12/2007 | Asai et al. | |
| 2008/0295686 A1 | 12/2008 | Neiderman et al. | |
| 2009/0242616 A1 | 10/2009 | Dautenhahn | |
| 2011/0272451 A1 | 11/2011 | Neiderman et al. | |
| 2011/0315746 A1 | 12/2011 | Dautenhahn | |
| 2013/0256389 A1 | 10/2013 | Ngai et al. | |

FOREIGN PATENT DOCUMENTS

| | | |
|---|---|---|
| JP | 2005079466 A | 3/2005 |
| JP | 2007109841 A | 4/2007 |
| WO | 2009/120414 A1 | 10/2009 |

* cited by examiner

US 8,940,099 B2

REFLOW OVEN AND METHODS OF TREATING SURFACES OF THE REFLOW OVEN

RELATED APPLICATION

This application is a Continuation-In-Part of U.S. patent application Ser. No. 13/437,530, filed on Apr. 2, 2012, entitled "REFLOW OVEN AND METHODS OF TREATING SURFACES OF THE REFLOW OVEN", which is hereby incorporated by reference in its entirety for all purposes.

BACKGROUND OF THE DISCLOSURE

1. Field of the Disclosure

This application relates generally to the surface mount of electronic components onto a printed circuit board by employing a reflow process, and more particularly to a reflow soldering oven that is designed to heat the printed circuit board during the reflow process.

2. Discussion of Related Art

In the fabrication of printed circuit boards, electronic components are often surface mounted to a bare board by a process known as "reflow soldering." In a typical reflow soldering process, a pattern of solder paste is deposited onto the circuit board, and the leads of one or more electronic component are inserted into the deposited solder paste. The circuit board is then passed through an oven where the solder paste is reflowed (i.e., heated to a melt or reflow temperature) in the heated zones and then cooled in a cooling zone to electrically and mechanically connect the leads of the electronic component to the circuit board. The term "circuit board" or "printed circuit board," as used herein, includes any type of substrate assembly of electronic components, including, for example, wafer substrates.

As stated above, present day reflow ovens have heating and cooling chambers. To achieve a consistent reflow process profile, flux needs to be extracted and collected away from the heating/cooling chambers. To achieve flux removal, there are two types of reflow ovens—air reflow ovens and inert atmosphere reflow ovens. With the air reflow ovens, flux is extracted by an exhaust system. With the inert atmosphere reflow ovens, a flux management system is used to extract flux from the heating/cooling chambers.

Both flux removal systems suffer from well-known shortcomings. With both systems, flux continues to deposit onto the inner walls of the heating/cooling chambers. Over time, the flux collected on the chamber walls create problems during production as excess flux may drip back onto actual production printed circuit boards, thereby potentially contaminating or otherwise compromising the attachment of components onto the printed circuit boards.

With current production requirements, it is desired to continuously operate fabrication equipment, including reflow ovens. Thus, when contemplating scheduled maintenance of the fabrication equipment, it is further desirable to keep down-time as short as possible. During such scheduled maintenance, the removal of flux on chamber walls is generally not addressed. Thus, ongoing flux contamination exposed to the printed circuit boards being produced would remain. Over time, excess flux may also cause premature failures of components of the reflow oven, including blowers designed to facilitate air circulation within the reflow oven chamber.

SUMMARY OF THE DISCLOSURE

An aspect of the disclosure is directed to a reflow oven of the type used to join electronic components to a substrate. In one embodiment, the reflow oven comprises a chamber housing including surfaces that are in contact with heated air mixed with contaminants, including flux, and an intermediate layer selectively applied to the surfaces of the chamber housing. Embodiments of the reflow oven may include fabricating the intermediate layer with a foam material. In one embodiment, the foam material includes foaming polymers, e.g., epoxy, polyurethane, polyester, and silicone. In another embodiment, the intermediate layer includes a non-foam material including non-foaming polymers, e.g., polytetrafluoroethylene and polyimide. The intermediate layer may include a film or foil applied to the surfaces of the chamber housing with an adhesive.

Another aspect of the disclosure is directed to a method of treating surfaces of a reflow oven exposed to contaminants, including flux. In one embodiment, the method comprises selectively applying an intermediate layer on the surfaces of the reflow oven. In some embodiments, the intermediate layer is applied by spraying, or by applying a light pressure when adhering a film or a foil with adhesive. Embodiments of the method may further include operating the reflow oven such that contaminants, including flux, adhere to the intermediate layer, and removing the intermediate layer from the surfaces of the reflow oven. In one embodiment, removing the intermediate layer from the surfaces of the reflow oven includes peeling the intermediate layer from the surfaces. In a particular embodiment, the peeling may be achieved by using a device to peel the intermediate layer from the surfaces. The device may include a putty knife. The method of removing the intermediate layer from the surfaces of the reflow oven may include applying a chemical to the intermediate layer and wiping off or peeling the intermediate layer from the surfaces.

The method further may comprise, after removing the intermediate layer, applying a new intermediate layer on the surfaces of the reflow oven. Applying the intermediate layer on the surfaces of the reflow oven includes spraying or brushing the intermediate layer.

Yet another aspect of the disclosure is directed to a reflow oven comprising a chamber housing including surfaces that are in contact with heated air mixed with contaminants, including flux, and a water-soluble layer selectively applied to the surfaces of the chamber housing. Embodiments of the reflow oven include an acrylic-based layer, such as an acrylic paint. In one embodiment, the acrylic paint includes a water-soluble polymer, a polymer emulsion, and water. The water-soluble polymer includes butyl benzyl phthalate. In some embodiments, the acrylic paint includes 1-10% by weight butyl benzyl phthalate, 30-55% by weight acrylic polymer emulsion, and balance water. In a certain embodiment, the acrylic paint includes 1-5% by weight butyl benzyl phthalate, 35-50% by weight acrylic poly emulsion, and balance water.

Another aspect of the disclosure is directed a method comprising: selectively applying an acrylic-based layer on the surfaces of the reflow oven. Embodiments of the method further may include: operating the reflow oven such that contaminants, including flux, repel from the acrylic layer; and removing the acrylic-based layer from the surfaces of the reflow oven. Removing the acrylic-based layer from the surfaces of the reflow oven may include peeling the acrylic-based layer away from the surfaces of the reflow oven. Peeling the acrylic-based layer away from the surfaces of the reflow oven involves using a device. In one embodiment, the device may include a putty knife. The method further may comprise, after removing the acrylic-based layer, applying a new acrylic-based layer on the surfaces of the reflow oven. Applying the acrylic-based layer on the surfaces of the reflow oven includes brushing the acrylic-based layer.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION OF THE DISCLOSURE

Figure 1:
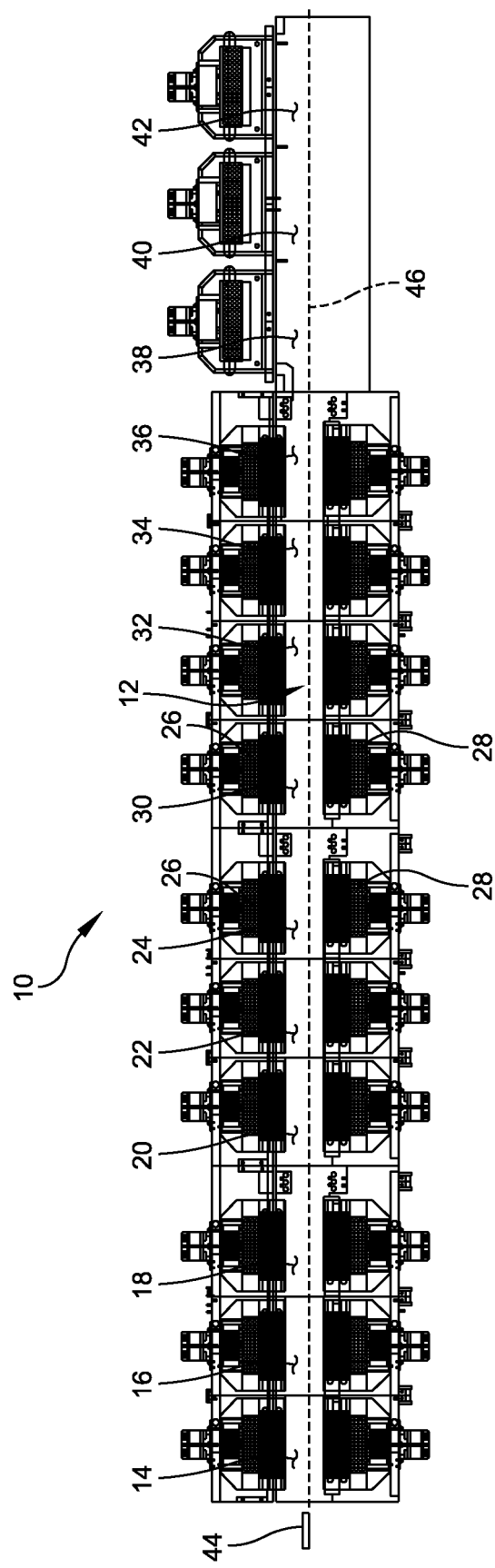
FIG. 1 is a schematic view of a reflow soldering oven of an embodiment of the disclosure.

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The principles set forth in this disclosure are capable of other embodiments and of being practiced or carried out in various ways. Also the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

Solder paste is routinely used in the assembly of printed circuit boards, where the solder paste is used to join electronic components to the circuit board. Solder paste includes solder for joint formation and flux for preparing metal surfaces for solder attachment. The solder paste may be deposited onto the metal surfaces (e.g., electronic pads) provided on the circuit board by using any number of application methods. In one example, a stencil printer may employ a squeegee to force the solder paste through a metallic stencil laid over an exposed circuit board surface. In another example, a dispenser may dispense solder paste material onto specific areas of the circuit board. Leads of an electronic component are aligned with and impressed into the solder deposits to form the assembly. In reflow soldering processes, the solder is then heated to a temperature sufficient to melt the solder and cooled to permanently couple the electronic component, both electrically and mechanically, to the circuit board. The solder typically includes an alloy having a melting temperature lower than that of the metal surfaces to be joined. The temperature also must be sufficiently low so as to not cause damage to the electronic component. In certain embodiments, the solder may be a tin-lead alloy. However, solders employing lead-free materials may also be used.

In the solder, the flux typically includes a vehicle, solvent, activators and other additives. The vehicle is a solid or nonvolatile liquid that coats the surface to be soldered and can include rosin, resins, glycols, polyglycols, polyglycol surfactants, and glycerine. The solvent, which evaporates during the pre-heat and soldering process, serves to dissolve the vehicle activators, and other additives. Examples of typical solvents include alcohols, glycols, glycol esters and/or glycol ethers and water. The activator enhances the removal of metal oxide from the surfaces to be soldered. Common activators include amine hydrochorides, dicarboxylic acids, such as adipic or succinic acid, and organic acids, such as citric, malic or abietic acid. Other flux additives can include surfactants, viscosity modifiers and additives for providing low slump or good tack characteristics for holding the components in place before reflow.

One embodiment of a reflow soldering apparatus for soldering the circuit board assembly is shown in FIG. 1. Such apparatus are sometimes referred to as reflow ovens or reflow soldering ovens in the art of printed circuit board fabrication and assembly. The reflow soldering oven, generally indicated at 10 in FIG. 1, includes a reflow oven chamber 12 in the form of a thermally insulated tunnel defining a passage for preheating, reflowing and then cooling solder on a circuit board passing therethrough. The reflow oven chamber 12 extends across a plurality of heating zones, including, in one example, three pre-heat zones 14, 16, 18 followed by three soak zones 20, 22, 24, each zone comprising top and bottom heaters 26, 28, respectively. The soak zones 20, 22, 24 are followed by four spike zones 30, 32, 34, 36, for example, which likewise include heaters 26, 28. And finally, three cooling zones 38, 40, 42 follow the spike zones 30, 32, 34, 36.

A circuit board assembly 44, including deposited solder paste and electronic components, is passed (e.g., left-to-right in FIG. 1) through each zone of the thermally insulated reflow oven chamber 12 on a fixed-speed conveyor, indicated by dashed lines at 46 in FIG. 1, thereby enabling controlled and gradual pre-heat, reflow and post-reflow cooling of the circuit board assembly. In the preliminary pre-heat zones 14, 16, 18, the board is heated from ambient temperature up to the flux activation temperature, which may range between about 130° C. and about 150° C. for lead-based solders and higher for lead-free solders.

In the soak zones 20, 22, 24, variations in temperature across the circuit board assembly are stabilized and time is provided for the activated flux to clean the component leads, electronic pads and solder powder before reflow. Additionally, VOCs in the flux are vaporized. The temperature in the soak zones 20, 22, 24 is typically about 140° C. to about 160° C. for lead-based solders and higher for lead-free solders. In certain embodiments, the circuit board assembly may spend about thirty to about forty-five seconds passing through the soak zones 20, 22, 24.

In the spike zones 30, 32, 34, 36, the temperature quickly increases to a temperature above the melting point of the solder to reflow the solder. The melting point for eutectic or near-eutectic tin-lead solder is about 183° C., with the reflow spike being typically set about 25° C. to about 50° C. above the melting point to overcome a pasty range of molten solder. For lead-based solders, a typical maximum temperature in the spike zones is in the range of about 200° C. to about 220° C. Temperatures above about 225° C. may cause baking of the flux, damage to the components and/or sacrifice joint integrity. Temperatures below about 200° C. may prevent the joints from fully reflowing. In one embodiment, the circuit board assembly is typically maintained at a temperature within the spike zones 30, 32, 34, 36 above the reflow temperature for about one minute.

Next, in the cooling zones 38, 40, 42, the temperature drops below the reflow temperature, and the circuit board assembly is cooled sufficiently to solidify the joints and thereby preserve joint integrity before the circuit board assembly leaves the reflow oven chamber 12.

A flux extraction/filtration system (not shown) may be provided to remove contaminant materials from the gas generated by the reflow soldering oven 10. In one embodiment, an input gas duct may be connected to or between selected zones to provide fluid communication from the reflow oven chamber 12 to the flux extraction/filtration system. An output gas duct may be connected to or between the selected zones to provide fluid communication from the flux extraction/filtration system back to the reflow oven chamber 12. In operation, a vapor stream is withdrawn from the reflow oven chamber 12 through the input gas duct, through the system, then through the output gas duct and back to the reflow oven chamber. Similar constructions of input gas ducts, systems and output gas ducts may be likewise positioned to withdraw vapor streams from or between other zones of the reflow soldering oven 10.

Figure 2:
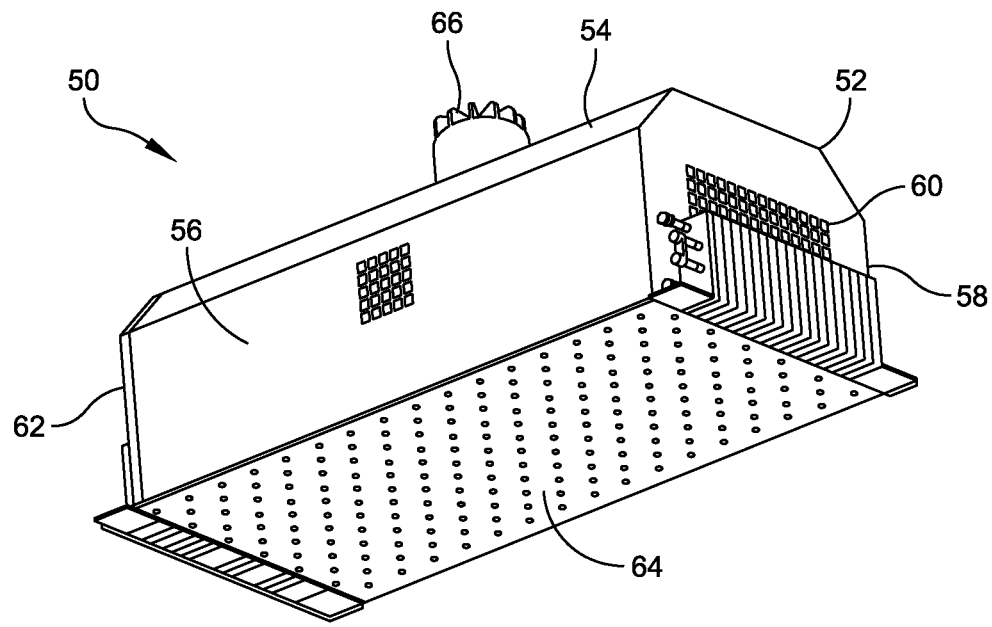
FIG. 2 is a perspective view of a reflow oven chamber of the reflow soldering oven.

Turning now to FIG. 2, the several zones (e.g., pre-heat zones 14, 16, 18, soak zones 20, 22, 24, and/or spike zones 30, 32, 34, 36) including heaters 26, 28 of the reflow oven include a reflow oven chamber assembly, which is generally indicated at 50. In the shown embodiment, the reflow oven chamber assembly 50 may embody one or more zones. It should be noted that the reflow oven chamber assembly 50 may be configured to have any suitable number of zones needed or required within the reflow soldering oven. Also, it should be noted that FIG. 2 illustrates the upper reflow oven chamber assembly 50. A similar lower reflow oven chamber assembly may be provided in addition to or in lieu of the upper reflow oven chamber assembly to deliver heated air from below the printed circuit board as the board travels through the reflow oven.

Figure 3:
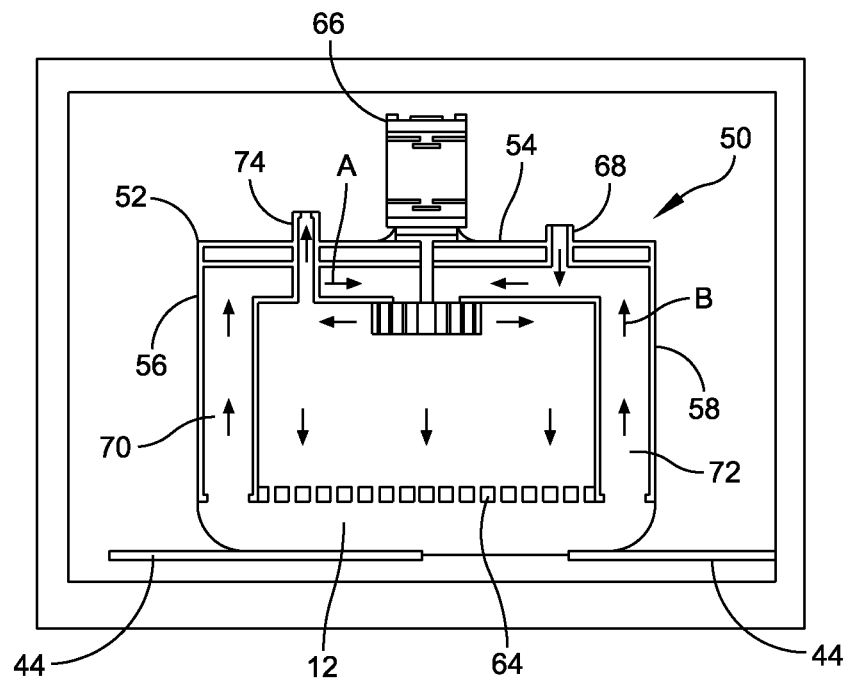
FIG. 3 is a schematic cross-sectional view of an interior of the reflow oven chamber.

Referring to FIGS. 2 and 3, the reflow oven chamber assembly 50 includes a rectangular-shaped chamber housing generally indicated at 52 having a top 54, two relatively longer sides 56, 58, two relatively shorter ends 60, 62, and a bottom, which functions as a diffuser plate 64. In one embodiment, the chamber housing 52 is fabricated from stainless steel. An air blower device 66 is provided on the top 54 of the chamber housing 52 to direct air from an inlet 68 provided in the top 54 of the chamber housing 52 to the reflow oven chamber 12. Air is exhausted out of plenums 70, 72 provided along respective sides 56, 58 of the chamber housing 52 toward an outlet 74, which is also provided in the top 54 of the chamber housing 52. The chamber housing 52 is configured to enclose and mount the components of the reflow oven chamber assembly 50, and is further configured to be suitably secured within the reflow oven chamber 12 of the reflow soldering oven 10.

The diffuser plate 64 distributes air from the reflow oven chamber assembly 50 to the reflow oven chamber 12. In a certain embodiment, the diffuser plate 64 consists of 192 holes in a staggered pattern to provide consistent, uniform airflow to the printed circuit board 44. These holes are stamped from sheet metal material such that they form a converging nozzle that results in a uniform airstream. The arrangement is such that airflow through the reflow oven chamber assembly 50 generated by the air blower device 66 with air entering the inlet 68 and exiting the diffuser plate 64. Specifically, air enters the inlet 68 as illustrated by arrows A and exits through the outlet 74 as illustrated by arrows B through the plenums 70, 72.

The surfaces of the chamber housing 52, including the diffuser plate 64 and the plenums 70, 72, may be treated with an intermediate layer of removable material to enable the easy removal of flux and other contaminants that build up over time on these surfaces. Specifically, the intermediate layer is applied by any suitable method during a maintenance procedure to the clean the stainless steel surfaces of the chamber housing 52. As flux builds up over time, the coating of intermediate layer is removed along with the built-up flux and associated contaminants. Thus, the easy removal of the intermediate layer and flux reduces the flux clean-up process significantly and eliminates flux contamination during production. Following the removal of the intermediate layer and flux contaminants, a new intermediate layer is applied or coated on the chamber walls, including the diffuser plate 64, during the maintenance procedure.

Figure 4:
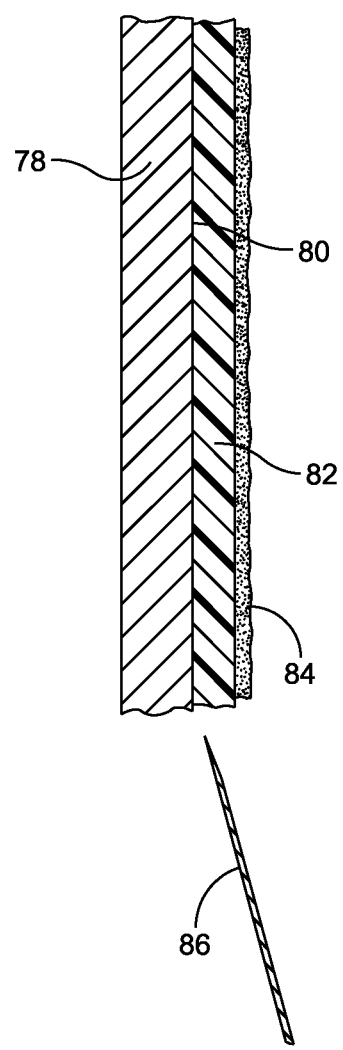
FIG. 4 is an enlarged cross-sectional view of a wall of the reflow oven chamber.

FIG. 4 illustrates a chamber wall 78 having a surface 80 with an intermediate layer or coating 82 applied to the surface of the chamber wall. As shown, over time, flux 84 builds up on the intermediate layer 82, and requires removal for the reasons described above. One manner in which the intermediate layer 82 is removed from the surface 80 of the chamber wall 78 is by using a device 86 to peel the intermediate layer from the chamber wall. The intermediate layer 82, while adhering to the surface 80 of the chamber wall 78, is sufficiently removable to be easily peeled away from the chamber wall with the device 86.

It should be understood that the provision of an intermediate layer 82 may be applied to reflow ovens having air or inert atmospheres and to reflow ovens having flux management systems. Thus, use of the term "air" herein is meant to include any gas within the reflow oven chamber, whether inert or not inert.

In certain embodiments, the intermediate layer exhibits the following properties: good adhesion to stainless steel; capable of withstanding a general operating temperature within the reflow oven chamber 12 of 400° C., with high oven temperatures nearing 600° C.; easily removable from stainless steel; and easily disposable. For example, in one embodiment, the intermediate layer material is a foam material, selected from foaming polymers including epoxy, polyurethane, polyester, and silicone. In another embodiment, the intermediate layer material is a non-foam material, selected from non-foaming polymers including polytetrafluoroethylene ("PTFE") and polyimide. In yet another example, the intermediate layer may be a non-foam material that can be transformed into a foam material by adding a chemical or foaming agent.

Methods of applying the intermediate layer include, and are not limited to, spraying and brushing the material onto the surfaces requiring coating. For example, any suitable spraying method may be employed, e.g., by a pressurized can. The spraying or brushing may be achieved either manually or automatically.

During a maintenance operation, in addition to other maintenance procedures, surfaces of the chamber housing may be accessible for cleaning. In one embodiment, the intermediate coating enables the surfaces to be peeled away from the surfaces of the chamber housing by hand or by using any suitable instrument, e.g., a device similar to a putty knife. The intermediate layer is designed to attract flux contaminants, while enabling the easy release of contaminant-exposed coating. Other methods may be used to remove the contaminated intermediate layer, such as wiping, brushing, and the like. Still further other methods may be used to remove the contaminated intermediate layer, such as an application of one or more chemicals onto the intermediate layer to break down the intermediate layer.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

For example, other intermediate layer materials may be selected for application on surfaces of the reflow oven chamber. For example, the intermediate layer material may be a polyphenol, an oil/lubricant, films, liners, performs, foils (e.g., aluminum foil), porous coatings, inorganic "friable" coatings, and removable panels (e.g., glass and stainless steel panels) and/or sheets (plastic or metal) that are adhered to the surfaces of the reflow oven chamber with adhesive, which is removable from the surfaces by peeling, wiping or any other suitable removal method.

In another embodiment, the layer may include a water-soluble layer, such as a water-soluble polymer. In one embodiment, the water-soluble layer includes an acrylic polymer emulsion-based layer, which may be applied to the surfaces of the reflow oven. In a particular embodiment, the acrylic polymer emulsion-based layer embodies an acrylic paint, which is a fast drying paint containing pigment suspended in acrylic polymer emulsion. Acrylic paints can be diluted with water, but become water-resistant when dry. In this embodiment, the painted surfaces do not necessarily collect flux contaminants. Stated another way, the flux contaminants do not adhere to the surfaces of the reflow oven chamber, but instead are repelled from the surfaces.

In a particular embodiment, the acrylic paint includes a water-soluble polymer, such as 1-10% by weight butyl benzyl phthalate, 30-55% by weight acrylic polymer emulsion, and balance water. In another embodiment, the acrylic paint includes a water-soluble polymer, such as 1-5% by weight butyl benzyl phthalate, 35-50% by weight acrylic polymer emulsion, and balance water, i.e., less than 55% by weight water. This composition creates a peelable coating that dries over time and is peeled off the surfaces of reflow oven chamber by suitable methods and devices. In this embodiment, flux contaminants stay within the space of the reflow oven chamber and are treated by a flux contamination system of the reflow oven. The forgoing composition is ideally suited for environments that are under 100° C., such as the cooling chambers of the reflow oven. As described, the acrylic paint can be suitably applied to the surfaces of the reflow oven chamber, such as by brushing.

The active ingredient is butyl benzyl phthalate, which is a phthalate, an ester of phthalic acid, benzyl alcohol and n-butanol. Butyl benzyl phthalate may be obtained under the Palatinol® BB, Unimoll® BB, Sicol® 160 or Santicizer® 160 trade names. Butyl benzyl phthalate may be used as a plasticizer for vinyl foams, such as polyvinylchloride or PVC. However, other phthalate-free plasticizers may be used in place of butyl benzyl phthalate. Also, in other embodiments, silicone-based resins can be used to replace the acrylic polymer emulsion.

When using the acrylic paint, the coating enables the surfaces to be peeled away from the surfaces of the chamber housing by hand or by using any suitable instrument, e.g., a device similar to a putty knife. As discussed, the layer is designed to repel flux contaminants, thus relying on the flux contamination system of the reflow oven to remove flux contaminants from the reflow oven chamber.

What is claimed is:

1. A method of treating surfaces of a reflow oven exposed to contaminants, including flux, the method comprising:
   selectively applying water-soluble layer on the surfaces of the reflow oven, the water-soluble layer including an acrylic-based layer.

2. The method of claim 1, further comprising:
   operating the reflow oven such that contaminants, including flux, repel from the water-soluble layer.

3. The method of claim 2, further comprising:
   removing the water-soluble layer from the surfaces of the reflow oven.

4. The method of claim 3, further comprising, after removing the water-soluble layer, applying a new water-soluble layer on the surfaces of the reflow oven.

5. The method of claim 2, wherein removing the water-soluble layer from the surfaces of the reflow oven includes peeling the water-soluble layer away from the surfaces of the reflow oven.

6. The method of claim 5, wherein peeling the water-soluble layer away from the surfaces of the reflow oven involves using a device.

7. The method of claim 6, wherein the device includes a putty knife.

8. The method of claim 1, wherein selectively applying the water-soluble layer on the surfaces of the reflow oven includes brushing the water-soluble layer.

9. The method of claim 1, wherein the ac layer includes an acrylic paint.

10. The method of claim 9, wherein the acrylic paint includes a water-soluble polymer, a polymer emulsion, and water.

11. The method of claim 10, wherein the water-soluble polymer includes butyl benzyl phthalate.

12. The method of claim 9, wherein the acrylic paint includes 1-10% by weight butyl benzyl phthalate, 30-55% by weight acrylic polymer emulsion, and balance water.

13. The method of claim 9, wherein the acrylic paint includes 1-5% by weight butyl benzyl phthalate, 35-50% by weight acrylic poly emulsion, and balance water.

* * * * *

UNITED STATES PATENT AND TRADEMARK OFFICE
CERTIFICATE OF CORRECTION

PATENT NO.          : 8,940,099 B2                                        Page 1 of 1
APPLICATION NO.     : 14/041316
DATED               : January 27, 2015
INVENTOR(S)         : Douglas Ngai et al.

It is certified that error appears in the above-identified patent and that said Letters Patent is hereby corrected as shown below:

In the Claims

Column 8, claim 9, line 35, replace "ac" with --acrylic-based--.

Signed and Sealed this
Fifth Day of May, 2015

Michelle K. Lee
*Director of the United States Patent and Trademark Office*